(12) United States Patent
Shestakov

(10) Patent No.: US 8,847,582 B2
(45) Date of Patent: Sep. 30, 2014

(54) METHOD OF ROBUST POSITION MEASUREMENT

(71) Applicant: GM Global Technology Operations LLC, Detroit, MI (US)

(72) Inventor: Roman Shestakov, Lambertville, MI (US)

(73) Assignee: GM Global Technology Operations, LLC, Detroit, MI (US)

( * ) Notice: Subject to any disclaimer, the term of this patent is extended or adjusted under 35 U.S.C. 154(b) by 213 days.

(21) Appl. No.: 13/625,444

(22) Filed: Sep. 24, 2012

(65) Prior Publication Data

US 2014/0084905 A1    Mar. 27, 2014

(51) Int. Cl.
*G01B 7/14*    (2006.01)
(52) U.S. Cl.
USPC .................................. 324/207.12; 324/207.24
(58) Field of Classification Search
USPC .................................................... 324/207.12
See application file for complete search history.

(56) References Cited

U.S. PATENT DOCUMENTS

| | | | | |
|---|---|---|---|---|
| 6,094,912 | A * | 8/2000 | Williford | 60/520 |
| 6,951,104 | B2 * | 10/2005 | Stobrawe et al. | 60/534 |
| 2012/0146625 | A1 * | 6/2012 | Grommer et al. | 324/207.12 |

* cited by examiner

*Primary Examiner* — Bot Ledynh

(57) ABSTRACT

A method of improving linear position sensing of clutch actuators with magnetic field sensors utilizes a dedicated magnetic field sensor solely to detect the ambient magnetic field. Typical three position hydraulic clutch actuators include a pair of active magnetic field sensors, one of such active sensors associated with each of a pair of pistons in such actuator and an adjacent pair of permanent magnets, one of such magnets associated with each of such pistons. The invention provides an additional magnetic field sensor disposed proximate the active magnetic field sensors which senses the surrounding (stray, background or parasitic) magnetic field proximate the active magnetic field sensors and provides a signal to an electronic circuit or software which actively and in real time corrects the signals from the active magnetic field sensors by cancelling out the magnitude of the stray magnetic field as detected by the additional sensor.

17 Claims, 3 Drawing Sheets

METHOD OF ROBUST POSITION MEASUREMENT

FIELD

The present disclosure relates to a method of providing robust linear position measurement in automotive applications and more particularly to a method of providing robust linear position measurement in automotive transmission applications by utilizing a magnetic field sensor for detecting background magnetic field strength.

BACKGROUND

The statements in this section merely provide background information related to the present disclosure and may or may not constitute prior art.

In many modern automotive transmissions, especially dual clutch transmissions (DCT's), a plurality of hydraulic actuators (operators) carry out commands that provide both a desired shift and shift sequence. In order to control such operators and confirm the attainment of a desired position, it is common practice to employ plural state or proportional linear position sensors that, in the former case, provide, for example, a signal that changes from a first state to a second state when a particular operator position has been achieved and, in the latter case, provide a signal that varies linearly (proportionally) between a first actuator position and a second actuator position.

Clearly the data from proportional sensors provides far more useful information as they not only indicate when multiple distinct actuator positions have been achieved but also provide the real time position of the actuator during translation and, if differentiated, the speed of the actuator. Because of these benefits, proportional sensors are by far the most commonly utilized linear position sensors and magnetic field sensors such as Hall effect sensors are the most common type.

In a typical magnetic field linear sensor assembly, a permanent magnet is mounted to a translating component such as the actuator piston, the output shaft or an associated shift rail and the magnetic sensor, which is stationary, is secured in proximate, sensing relationship with the permanent magnet to a housing, flange, web or other stationary transmission component. Translation of the permanent magnet thus varies the magnetic field strength sensed by the sensor and, with proper conditioning, scaling and software, the position of the actuator and associated shift components can be determined.

While accurate and dependable, the magnetic field strength sensor is not without drawbacks. Arguably the most problematic is its susceptibility to stray magnetic fields. A stray field can mimic the field produced by the associated permanent magnet such that the magnetic field sensor may provide a signal indicating that an actuator is in a certain position when it is not. Contrariwise, a stray magnetic field may interfere with the field from the permanent magnet and cause a sensor to indicate that an actuator and associated shift components have failed to achieve a desired position when, in fact, they have.

One approach to this problem is to provide shielding proximate the magnetic field sensor of materials such as mu metal which are designed to minimize stray magnetic fields and thus reduce inaccurate signals from the magnetic field sensor. Unfortunately, this solution adds weight and, in the case of an automatic motor vehicle transmission, occupies space in an already crowded environment. Furthermore, it is often difficult to sufficiently shield the sensor as certain regions must be left unshielded to allow the sensor to function properly.

From the foregoing, it is apparent that improvements in the art of magnetic field sensor isolation would be both desirable and beneficial. The present invention is so directed.

SUMMARY

The present invention provides a method of improving linear position sensing of clutch and shift actuators (operators) by magnetic field sensors by providing an additional dedicated magnetic field sensor intended solely to detect the ambient magnetic field and changes therein. Specifically, in a typical dual clutch transmission, a three position hydraulic clutch actuator will include a pair of active magnetic field sensors, one of such active sensors associated with each of a pair of pistons in such actuator and an adjacent pair of permanent magnets, one of such magnets associated with each of such pistons. The invention comprehends providing an additional magnetic field sensor disposed proximate the active magnetic field sensors which senses the surrounding (stray, ambient, parasitic or background) magnetic field proximate the active magnetic field sensors (but which is insensitive to the magnets associated with the pistons) and provides a signal to a compensating circuit which actively and in real time corrects the signals from the active magnetic field sensors by cancelling out the stray magnetic field as detected by the additional sensor. Thus, the stray (parasitic) magnetic field is effectively eliminated and the signals from the active sensors have a greatly improved integrity, accuracy, robustness and reliability. Depending upon the locations of the active sensors and the desired degree of accuracy required by the system, that is, how accurately and completely the stray or parasitic signal(s) must be cancelled or suppressed, more than one additional (compensating) magnetic field sensor may be utilized.

Thus it is an aspect of the present invention to provide a method of improving the accuracy and robustness of signals provided by magnetic field piston position sensors in a motor vehicle transmission.

It is a further aspect of the present invention to provide a method of sensing and cancelling the ambient or parasitic magnetic field sensed by magnetic field actuator position sensors in a motor vehicle transmission.

It is a still further aspect of the present invention to provide a method of utilizing active and compensating magnetic field sensors to eliminate ambient magnetic field signals from the outputs of the active actuator piston position sensors.

It is a further aspect of the present invention to provide apparatus including active and compensating magnetic field sensors to eliminate ambient magnetic field interference from the signals from the active actuator piston position sensors.

Further aspects, advantages and areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
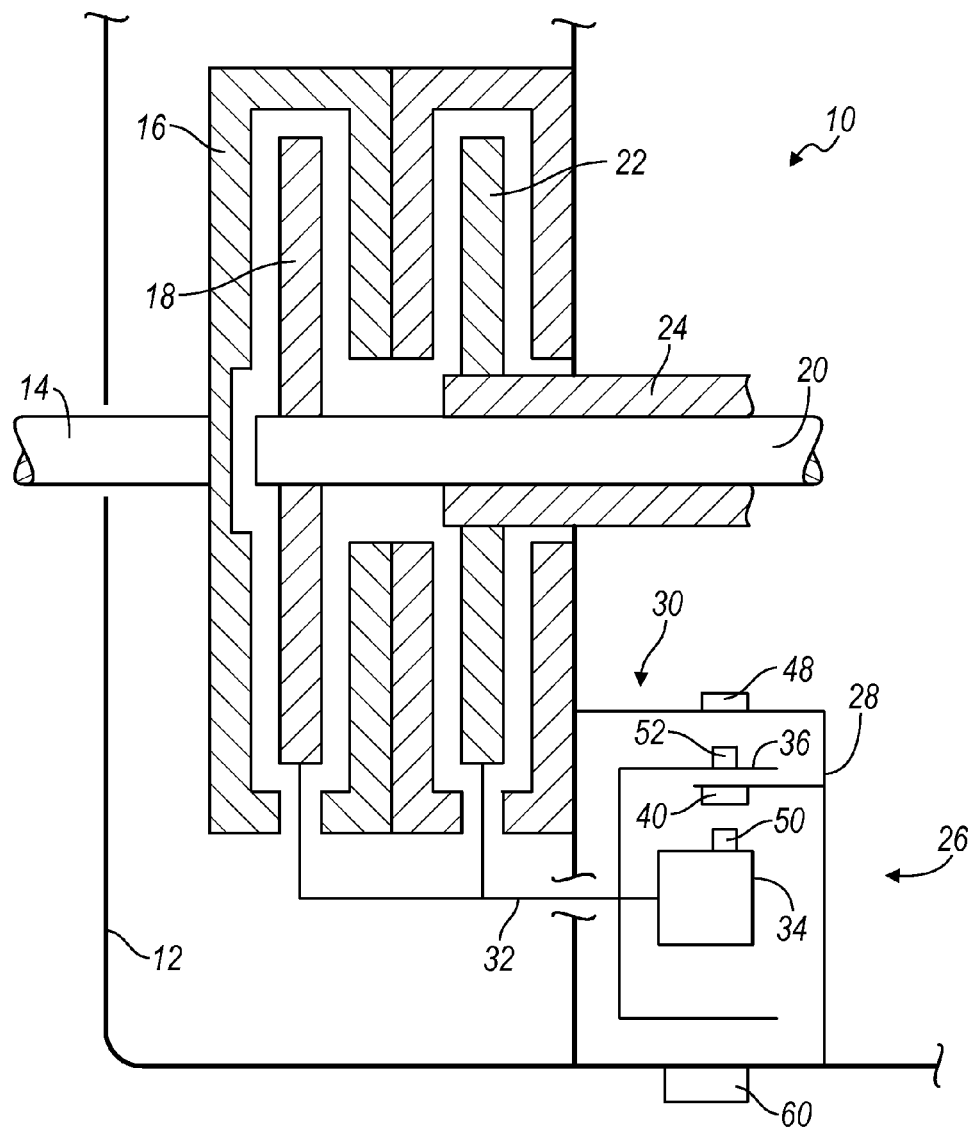
FIG. 1 is a schematic, side elevational view of a portion of a dual clutch transmission incorporating the present invention.
Figure 2:
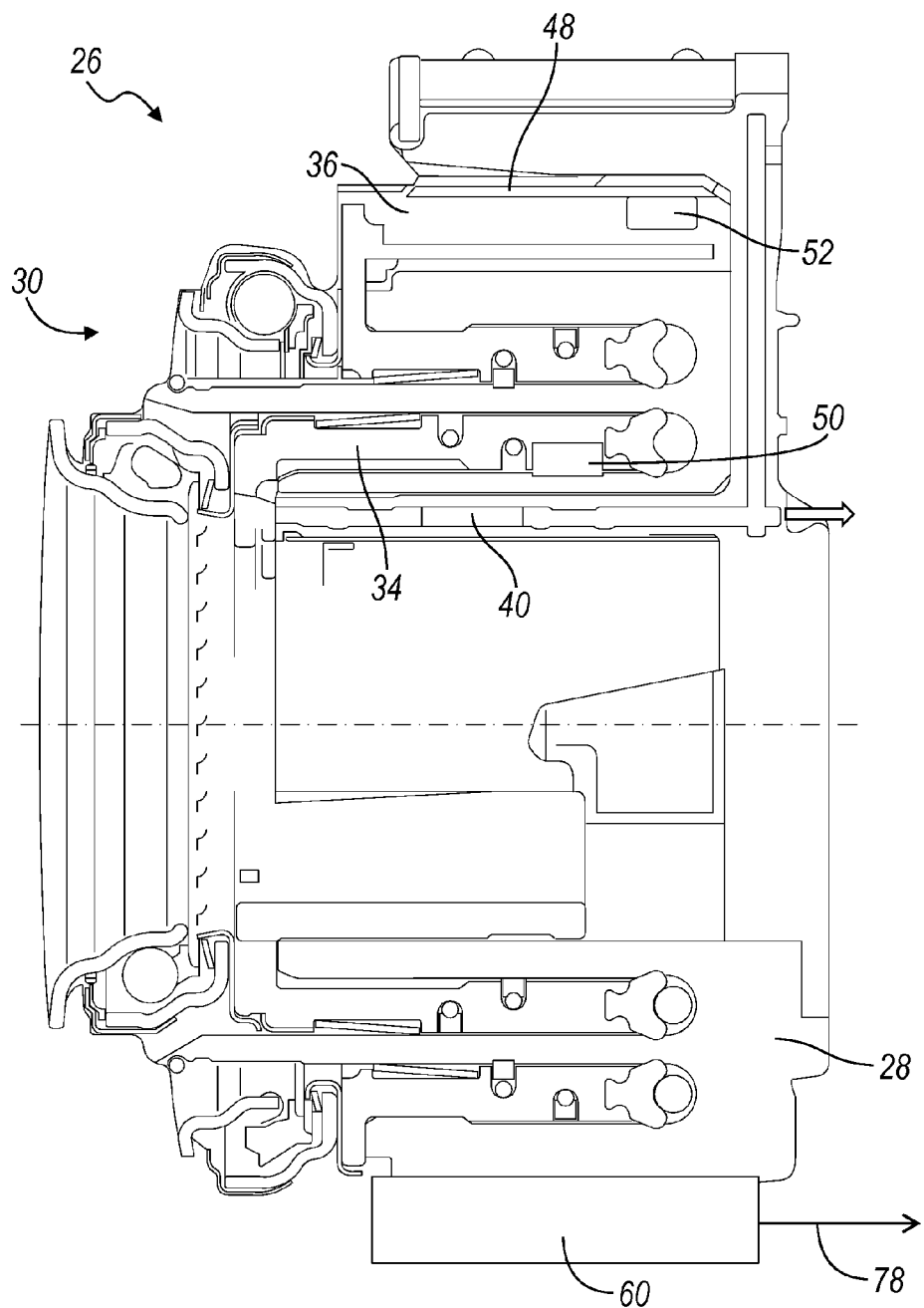
FIG. 2 is an enlarged, sectional view of a hydraulic actuator incorporating the magnetic field sensors of the present invention.

With reference to FIGS. 1 and 2, a portion of a dual clutch transmission is illustrated and generally designated by the reference number 10. The transmission 10 includes a cast metal housing 12 which receives, locates, supports and protects various mechanical components such as gears, shafts, bearings, actuators, hydraulic fluid passageways and the like. The transmission includes an input shaft 14 which drives a clutch input member or housing 16. Disposed within the clutch input member or housing 16 is a first friction clutch plate or disc 18 coupled to a first clutch output member or shaft 20 and a second friction clutch plate or disc 22 coupled to a second clutch output member or quill 24.

One of the transmission actuators 26 actuates or operates the friction clutches 18 and 22 and is illustrated in FIG. 1. The actuator 26 includes a cylindrical housing or cylinder 28 that may be integrally formed with or installed within the metal housing 12 and that receives a bi-directionally translating piston assembly 30. Typically and preferably, the housing 12 and the cylinder 28 will be cast of aluminum, magnesium or other non-magnetic metal or alloy. The piston assembly 30 is coupled to the friction clutches 18 and 22 by a clutch linkage 32 that is connected to and bi-directionally and independently translates the friction clutch plates or discs 18 and 22 into contact with the clutch input member or housing 16 to independently provide drive torque to the first clutch output member or shaft 20 or the second clutch output member or quill 24 and thence to gear pairs (not illustrated) within the transmission 10.

As noted, the piston assembly 30 independently engages one of the two friction clutches 18 and 22. It thus translates between and provides three distinct positions: a center or neutral position, a first, terminal position at a first, for example, left, end which engages the first friction clutch 18 and a second terminal position at a second, for example, right end which engages the second friction clutch 22. As such, the piston assembly 30 will typically include a first or inner piston 34 and a second or outer piston 36. A controlled supply of pressurized hydraulic fluid to the faces of the first or inner piston 34 and the second or outer piston 36 determines the position of the clutch linkage 32 and friction clutches 18 and 22 as described above.

Figure 3:
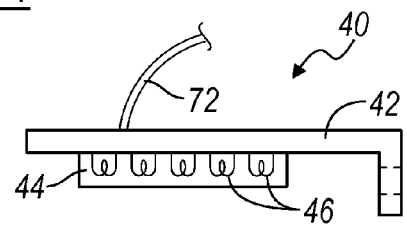
FIG. 3 is an enlarged, side elevational view of a linear magnetic field sensor assembly according to the present invention.

Referring now to FIG. 3, a typical and exemplary magnetic field sensor assembly 40 for sensing the position of the pistons 34 and 36 is illustrated. The magnetic field sensor assembly 40 includes a non-ferrous frame or mounting bracket 42 that supports and positions a magnetic sensor 44. The magnetic sensor 44 is an elongate bar or member that encapsulates a plurality of magnetic coils 46. The number of magnetic coils 46 is dependent upon the extent of motion of the pistons 34 and 36, the size (length) of the magnetic sensor 44 and the desired degree of accuracy, that is, linear definition or resolution, to be provided by the sensor 44, with more magnetic coils 46 providing higher accuracy and resolution. From four to ten magnetic coils 46 have been found to be satisfactory for most applications but more or fewer may be utilized as necessary and desired.

Referring again to FIGS. 1 and 2, secured to and disposed proximate the magnetic field sensor assembly 40 such that it is in sensing relationship therewith is a permanent magnet 50 that is attached to and translates with the first or inner piston 34. Similarly, the second or outer piston 36 includes a second permanent magnet 52 that is attached to it and translates therewith and a second magnetic field sensor assembly 48 disposed proximate the second permanent magnet 52 thereby sensing translation the second or outer piston 36. As noted above, the housing 12 and the cylinder 28 are typically and preferably cast of a non-magnetic metal or alloy such as aluminum or magnesium such that the (moving) magnetic fields of the magnets 50 and 52 may be readily sensed by the magnetic field sensor assemblies 40 and 48, respectively.

Also disposed in the housing 12 preferably opposite, that is, diametrically opposed to, the magnetic field sensor assembly 40 and the second magnetic field sensor 48 but at a distance from the permanent magnet 50 and the second permanent magnet 52 is a compensating magnetic field sensor 60. The compensating magnetic field sensor 60 is located so that it is essentially insensitive to and unaffected by the magnetic fields of the permanent magnets 50 and 52 but will sense and provide data regarding the overall magnetic field, that is, the ambient or surrounding magnetic field, that the transmission 10 is exposed or subjected to in real time. Accordingly, the compensating magnetic field sensor 60 preferably requires a single coil 62 which generally senses the ambient (parasitic) magnetic field or fields to which the transmission 10 is exposed at any given time. The term "parasitic" is utilized herein to denote the unwanted and interfering background or stray magnetic fields imposed on the transmission 10 by any source, for example, magnetized steel components in bridges and roads, tools and equipment or high current carrying wires.

Figure 4:
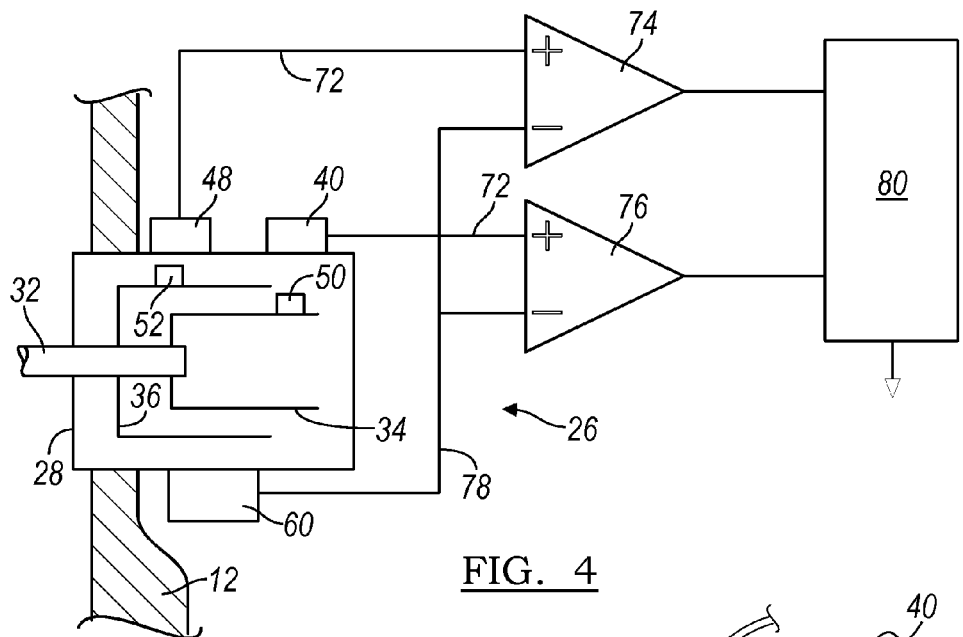
FIG. 4 is a schematic diagram of the mechanical and electrical components of an exemplary linear position sensing circuit incorporating the present invention.

Referring now to FIG. 4, a schematic and exemplary diagram of a compensated linear position sensing circuit for a vehicle transmission is designated by the reference number 70. At the outset, it should be understood that the circuit 70 is provided primarily to illustrate the signal or data flow and processing and that integrated electronic compensating circuits and digital signal analysis and conditioning utilizing software and specific algorithms can be utilized to undertake the signal processing described herein. The circuit 70 includes the first magnetic field sensor assembly 40, the first permanent magnet 50 on the first or inner piston 34, the second magnetic field sensor assembly 48, the second permanent magnet 52 on the second or outer piston 36 and the compensating magnetic field sensor 60. Multiple conductor cables 72 carry the outputs of the first sensor assembly 40 and the second sensor assembly 48 to inputs of comparators 74 and 76. Provided to the inverting inputs of the comparators 74 and 76 is the signal from the compensating magnetic field sensor 60 in a cable 78. The comparators 74 and 76 sum the signals provided to their inputs thereby effectively cancelling out the stray, background or parasitic magnetic field signal. Stated somewhat differently, the comparators 74 and 76 essentially function as out-of-phase summing devices wherein the signals from, for example, the first and second magnetic field sensor assemblies 40 and 48 are of one phase and are applied to the positive inputs and thus may be utilized to cancel out the signal from the compensating magnetic field sensor 60 which is of the same phase but which is applied to the negative inputs. It should be understood that other electronic circuits as well as software and algorithms utilized by microprocessors wherein the signal from the compensating magnetic field sensor 60 representing the background or parasitic magnetic field is utilized to correct and suppress the interfering signal in the outputs of the first and second magnetic field sensor assemblies 40 and 48 are deemed to be within the purview of the present invention.

Because both the first and second magnetic field sensor assemblies 40 and 48 and the compensating magnetic field sensor 60 are exposed or subjected to an external or parasitic magnetic field whereas only the first and second magnetic field sensor assemblies 40 and 48 are exposed or subjected to the fields from their respective permanent magnets 50 and 52, when the signal from the compensating magnetic field sensor 60 is inverted and summed (added) to the signals from the first and second magnetic field sensor assemblies 40 and 48, the external or parasitic field sensed by the first and second magnetic field sensor assemblies 40 and 48 is cancelled out, leaving only the signal (data) from the first and second magnetic field sensor assemblies 40 and 48 generated by the permanent magnets 50 and 52, respectively, which represents the positions of the pistons 34 and 36. These signals (data) are provided to a transmission control module 80 where they are utilized to provide highly accurate information regarding the current, real time position of the pistons 34 and 36. The transmission control module 80 may also contain a microprocessor which includes sub-routines, algorithms and look up tables which accept the signals from the comparators 74 and 76 or other electronic devices and provide data utilized in subsequent components and operations which represent the real time positions of the pistons 34 and 36 and thus of the shift linkage 32 and the friction clutches 18 and 22 (illustrated in FIG. 1).

Figure 5:
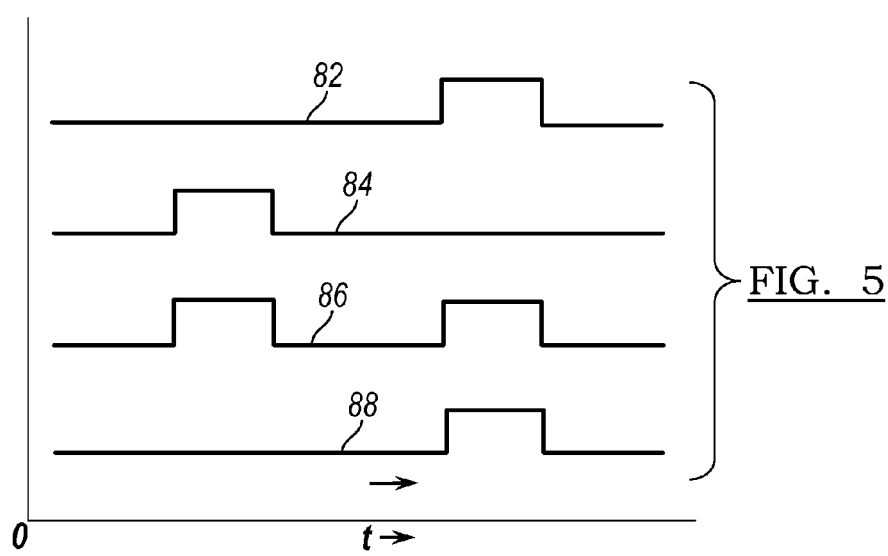
FIG. 5 is a graph presenting plots of actuator position sensor output, ambient magnetic field strength and compensated or corrected actuator position sensor output.

FIG. 5 provides a time based graph of various plots associated with operation of the present invention. The horizontal (X) axis represents time and the vertical (Y) axis displays multiple signals and transient operating states. At the outset, it should be noted that the vertical alignment of the plots is significant and permits ready comparison of signals (data) without and with the present invention and its effect. The first plot 82 illustrates a signal from one of the magnetic field sensor assemblies 40 or 48, the transient or impulse to the right indicating achievement of a certain position of, for example, the piston 34 or 36. The second plot 84 represents a transient interference event (on the left) wherein the transmission 10 is exposed or subjected to a momentary parasitic magnetic field from a magnetized bridge, road component or other source.

The third plot 86 is again the signal from one of the magnetic field sensor assemblies 40 or 48 which is the sum of the first plot 82 and the second plot 84. That is, it is the signal from one of the magnetic field sensors assemblies 40 or 48 that has been affected by the transient interference event of plot 84 which is also providing data from the translation of the one of the pistons 34 or 36 as presented in plot 82. Note that the spurious and unwanted data from the interference event may mimic the desired data from translation of the piston 34 or 36, rendering accurate computation of the actual position of the piston 34 or 36 difficult or impossible. The fourth plot 88 represents the output of the comparators or operational amplifiers 74 and 76 provided to the transmission control module 80. Here, the spurious, parasitic signal sensed by the compensating magnetic field sensor 60 of plots 84 and 86 has been removed, leaving the signal (data) that represents the true, real time position of the piston 34 or 36. It should be understood that the rectangles of the plots 82, 84, 86 and 88 representing magnetic field strengths and signals have been employed to facilitate explanation and comparison and that actual time-based plots of the magnetic field strengths and signals may take various shapes such as sinusoids, trapezoids and shapes other than the rectangles shown.

As described above, it is assumed that a single compensating magnetic field sensor 60 provides a signal sufficiently representative of the parasitic magnetic field to which the transmission 10 and its various actuators and position sensors are exposed so that only one compensating magnetic field sensor 60 need be utilized. However, depending upon the required accuracy of the signals generated and provided to, for example, the transmission control module 80, and the specific locations of the various magnetic field sensor assemblies 40 and 48 as well as magnetic field sensors associated with other hydraulic actuators, it may be preferable and desirable to utilize additional compensating magnetic field sensors, for example, in multiple locations proximate other actuators and in locations remote from that of the single compensating magnetic field sensor 60. Such a transmission, with multiple compensating magnetic field sensors is fully within the purview of the present invention.

The description of the invention is merely exemplary in nature and variations that do not depart from the gist of the invention are intended to be within the scope of the invention. Such variations are not to be regarded as a departure from the spirit and scope of the invention.

What is claimed is:

1. A method of determining a position of an actuator piston comprising the steps of:
providing a hydraulic actuator having a piston,
providing a permanent magnet attached to said piston,
providing a first magnetic field sensor in sensing relationship with said permanent magnet,
providing a second magnetic field sensor proximate said first magnetic field sensor and substantially isolated from said permanent magnet, and
correcting an output of said first magnetic field sensor by an output of said second magnetic field sensor to compensate for stray magnetic fields.

2. The method of determining a position of an actuator piston of claim 1 further including the steps of providing a second piston in said hydraulic actuator, providing a second permanent magnet attached to said second piston, providing a third magnetic field sensor in sensing relationship with said second permanent magnet and correcting a third output of said third magnetic field sensor by the output of said second magnetic field sensor to compensate for stray magnetic fields.

3. The method of determining a position of an actuator piston of claim 2 further including the step of providing said corrected output from said first magnetic field sensor and said third magnetic field sensor to a control module.

4. The method of determining a position of an actuator piston of claim 1 further including the step of providing said corrected output from said first magnetic field sensor to a transmission control module.

5. The method of determining a position of an actuator piston of claim 1 wherein said piston translates a shift rail and at least one synchronizer clutch.

6. The method of determining a position of an actuator piston of claim 5 further including the step of providing a transmission housing for receiving said hydraulic actuator, said shift rail and said at least one synchronizer clutch.

7. The method of determining a position of an actuator piston of claim 1 wherein said correcting step is achieved by summing out of phase signals from said first magnetic field sensor and said second magnetic field sensor.

8. A method of providing a corrected piston position signal for a hydraulic actuator comprising the steps of:
providing a hydraulic actuator having a first piston,
providing a first permanent magnet attached to said first piston,
providing a first piston magnetic field sensor in sensing relationship with said first permanent magnet,
providing a stray magnetic field sensor substantially isolated from said first permanent magnet; and
compensating an output of said first piston magnetic field sensor by an output of said stray magnetic field sensor to correct for stray magnetic fields.

9. The method of providing a corrected piston position signal of claim 8 further including the steps of providing a second piston in said hydraulic actuator, providing a second permanent magnet attached to said second piston, providing a second piston magnetic field sensor in sensing relationship with said second permanent magnet and compensating a second output of said second magnetic field sensor by the output of said stray magnetic field sensor to correct for stray magnetic fields.

10. The method of providing a corrected piston position signal of claim 9 further including the step of providing said compensated output from said first piston magnetic field sensor and said second piston magnetic field sensor to a transmission control module.

11. The method of providing a corrected piston position signal of claim 8 further including the step of providing said compensated output from said first piston magnetic field sensor to a transmission control module.

12. The method of providing a corrected piston position signal of claim 8 further including the step of providing a transmission housing for receiving said hydraulic actuator, a shift rail translated by said hydraulic actuator and at least one synchronizer clutch translated by said shift rail.

13. The method of providing a corrected piston position signal of claim 8 further including the step of providing a comparator having positive and negative inputs.

14. A method of compensating a piston position signal affected by a parasitic magnetic field comprising the steps of:
providing a hydraulic actuator having a first piston,
providing a first permanent magnet disposed for translation with said first piston,
providing a first magnetic field sensor in sensing relationship with said first permanent magnet,
providing a parasitic magnetic field sensor substantially isolated from said first permanent magnet; and
compensating an output of said first magnetic field sensor by an output of said parasitic magnetic field sensor to correct for a parasitic magnetic field,
whereby a signal induced in said first magnetic field sensor by a parasitic magnetic field is removed.

15. The method of compensating a piston position signal affected by a parasitic magnetic field of claim 14 further including the steps of providing a second piston in said hydraulic actuator, providing a second permanent magnet attached to said second piston, providing a second magnetic field sensor in sensing relationship with said second permanent magnet and compensating a second output of said second magnetic field sensor by the output of said parasitic magnetic field sensor to correct for parasitic magnetic fields.

16. The method of compensating a piston position signal affected by a parasitic magnetic field of claim 14 further including the step of providing a transmission housing for receiving said hydraulic actuator, said first magnetic field sensor and said a parasitic magnetic field sensor.

17. The method of compensating a piston position signal affected by a parasitic magnetic field of claim 14 wherein said compensating step is achieved by summing out of phase signals from said first magnetic field sensor and said parasitic magnetic field sensor.

* * * * *